United States Patent [19]

Nezu

[11] Patent Number: 4,837,407
[45] Date of Patent: Jun. 6, 1989

[54] PLASTIC ELECTRICALLY INSULATING SUBSTRATES FOR WIRING CIRCUIT BOARDS AND A METHOD OF MANUFACTURING THEREOF

[75] Inventor: Shinji Nezu, Farmington Hills, Mich.

[73] Assignee: Aisin Seiki Company, Ltd., Kariya, Japan

[21] Appl. No.: 31,555

[22] Filed: Mar. 30, 1987

[51] Int. Cl.$^4$ .............................................. H05K 01/03
[52] U.S. Cl. .................................. 174/68.5; 361/386; 361/387; 361/414; 428/901
[58] Field of Search ............... 361/414, 386, 387, 398; 428/901; 174/68.5

[56] References Cited

U.S. PATENT DOCUMENTS

| | | | |
|---|---|---|---|
| 2,876,393 | 3/1959 | Tally et al. | 361/414 X |
| 3,781,596 | 12/1973 | Galli | 361/398 |
| 3,932,689 | 1/1976 | Watanabe et al. | 428/473.5 X |
| 4,472,485 | 9/1984 | Tabuse et al. | 428/910 |
| 4,517,255 | 5/1985 | Kanda et al. | 428/910 X |
| 4,544,989 | 10/1985 | Nakabu et al. | 361/386 X |
| 4,647,508 | 3/1987 | Gazit et al. | 428/473.5 X |
| 4,679,122 | 7/1987 | Belke et al. | 361/414 |
| 4,689,110 | 8/1987 | Leibowitz | 361/414 X |
| 4,690,845 | 9/1987 | Kloss | 428/901 X |
| 4,735,847 | 4/1988 | Fujiwara et al. | 428/901 X |

OTHER PUBLICATIONS

"Thermal Conductivity of Oriented Crystalline Polymers" by C. L. Choy et al, Journal of Polymer Science: Polymer Physics Edition, vol. 18, 1187-1207 (1980).

Primary Examiner—R. R. Kucia
Attorney, Agent, or Firm—Oblon, Fisher, Spivak, McClelland & Maier

[57] ABSTRACT

A plastic electrically insulating substrate, having high thermal conductivity, for wiring circuit boards including a substrate having a front surface for mounting an electrical device back surface.

The substrate is made of a laminate of a plurality of oriented sheets of one or more semicrystalline polymers having a uniform oriented direction of the sheets, and wherein the oriented direction of the sheets is arranged in the direction of the substrate thickness.

6 Claims, 1 Drawing Sheet

PLASTIC ELECTRICALLY INSULATING SUBSTRATES FOR WIRING CIRCUIT BOARDS AND A METHOD OF MANUFACTURING THEREOF

BACKGROUND OF THE INVENTION

1. Field of the Invention

This invention relates to plastic electrically insulting substrates for wiring circuit boards. More particularly, the present invention relates to plastic electrically insulating substrates for wiring circuit boards which have excellent thermal conductivity along the thickness direction.

2. Description of the Background

Wiring circuit boards are referred to as electrical parts on which electrical devices such as a transistor or IC, i.e. Integrated Circuit, is mounted and connected. Conventional wiring circuit boards are formed with electrically insulating substrates and conducting materials. Both inorganic and organic materials have been used as electrically insulating substrates. The properties required for insulating substrates include high electrically insulating resistability, dimensional stability, heat resistability, and high thermal conductivity for heat dissipation.

Polymers which have been used as insulating substrates include bismaleimide triazine resin, polyimide, epoxy, polybutadiene, and polytrifluoroethylene.

These polymers have reasonably good mechanical and electrical properties for wiring circuit boards However, none of these polymers have sufficient thermal conductivity, as compared to a ceramic insulating material, such as alumina ($Al_2O_3$).

However, plastic substrates having high thermal conductivity are needed to dissipate the heat produced on front surface mountings of the aforesaid electrical device by operation of the aforesaid electrical devices or by thin film resistors to the back surface, namely in the direction of the thickness of substrates, in order to allow for the production of systems which are small and reliable.

Although studies regarding polymers which are inherently thermally conductive are relatively scanty, it has been found that when a semicrystalline polymer is oriented by, for example, drawing, the thermal conductivity only taken along the orientation direction increases rapidly while the thermal conductivity in the perpendicular direction shows a moderate decrease. However these drawn semicrystalline polymers cannot be used as electrically insulating substrates for wiring circuit boards because the drawn semicrystalline polymer sheets do not conduct heat well along the thickness direction. For electrically insulating substrates, it is essential that heat produced by the aforesaid electrical devices mounted on the front surface of substrates be conducted to the back surface for heat dissipation in order to increase the effective area of heat dissipation.

SUMMARY OF THE INVENTION

Accordingly, it is an object of the present invention to provide an electrically insulating substrate for a wiring circuit board which has excellent thermal conductivity along the thickness direction.

It is also an object of the present invention to provide an improved method of manufacturing an electrically insulating substrate for a wiring circuit board which has excellent thermal conductivity along the thickness direction.

According to the present invention, the foregoing and other objects are obtained by providing a method of manufacturing an electrically insulating substrate which entails:

(1) Orienting a plurality of sheets of semicrystalline polymers at a temperature slightly below the crystalline melting transition, (2) Laminating the oriented sheets, making the direction of all the oriented sheets uniform, and (3) Slicing the laminates with a width corresponded to a desired thickness of an insulating substrate in the vertical direction against the oriented direction of the sheets.

BRIEF DESCRIPTION OF THE DRAWINGS

Various other objects, features and attendant advantages of the present invention will be more fully appreciated as the same becomes better understood from the following detailed description when considered in connection with the accompanying drawings.

DESCRIPTION OF THE PREFERRED EMBODIMENTS

Figure 1:
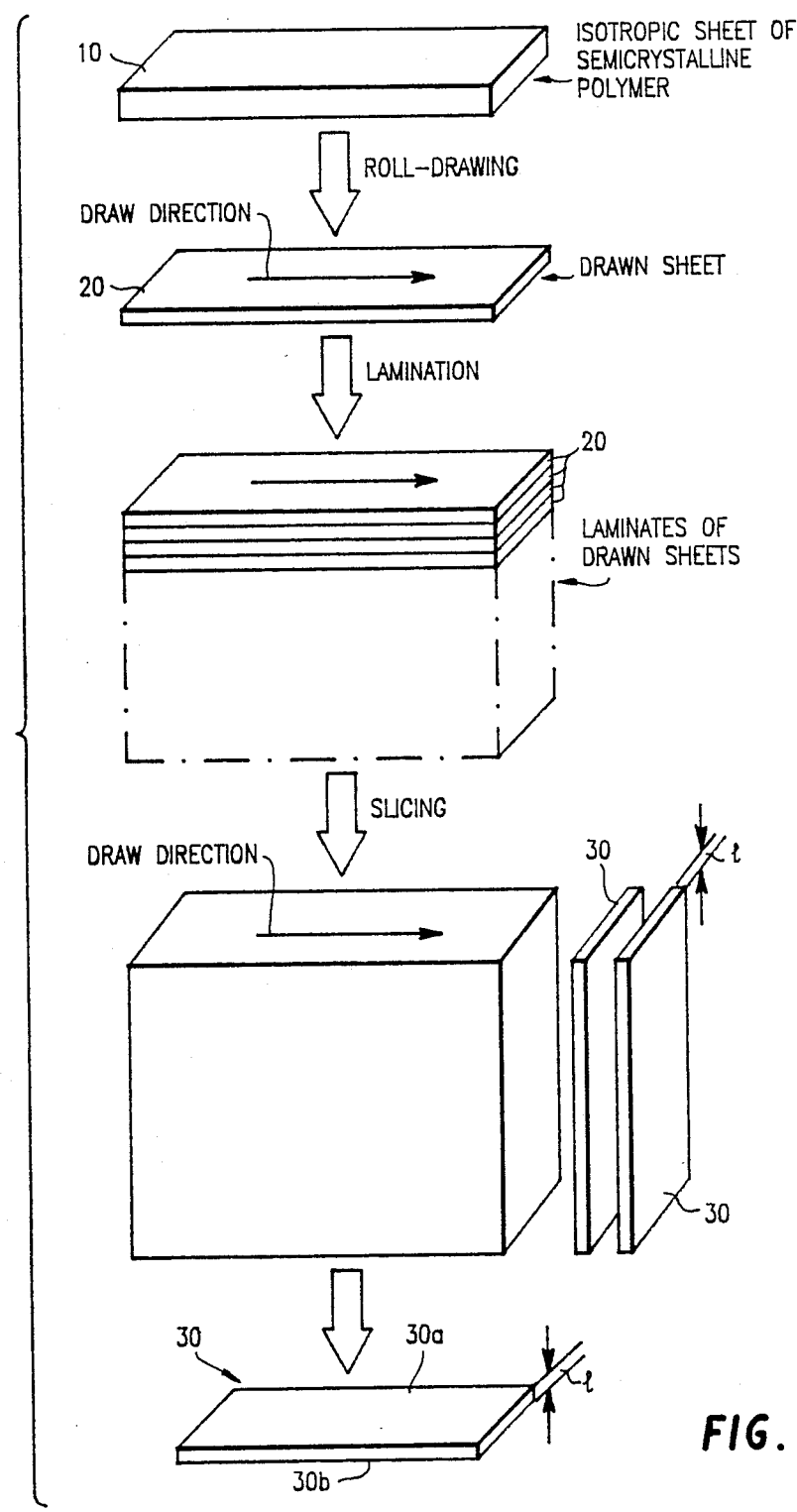
FIG. 1 is a schematic view of a manufacturing process of an electrically insulating substrate according to the present invention.

According to the present invention, various polymers may be used as electrically insulating substrates for wiring circuit boards, such as poly(ethylene terephthalate), poly(vinylidine fluoride), polychlorotrifluoroethylene, polyethylene, polypropylene, polyoxymethylene, and polyetherketones, for example. One or more of such polymers may be used. The pellets of a desired resin are compression molded into an isotropic sheet 10, as shown in FIG. 1, to a desired thickness, which is then cooled and preheated to the orienting temperature. An oriented sheet 20, as shown in FIG. 1, is obtained by roll-drawing the isotropic sheet 10 in a predetermined direction at a temperature slightly below the crystalline melting transition for the resins used.

The oriented sheets 20 are cut into a rectangular shape, laminated and then made directionally uniform by either ultrasonic welding or by gluing with an adhesive.

The laminates are sliced with a width l corresponded to a thickness l the desired thickness, of an electrical insulating substrate 30 in the vertical direction against the oriented direction of sheet 20, using a circular saw.

The substrate 30, as shown in FIG. 1, has a front surface 30a for mounting an electrical device, such as a transistor or IC, a back surface 30b and a thickness l. The mounted transistor or IC is not shown in FIG. 1.

In order to further illustrate the present invention, examples are provided hereinbelow. However, these examples are only for purposes of illustration and are not intended to limit the present invention.

Additionally, numerical reference is made in these examples to FIG. 1.

EXAMPLE 1

A plurality of isotropic sheets 10 (10 mm thickness, 15 cm wide) of polypropylene were prepared by compression molding of the polymer pellets at about 200° C. The sheets 10 were then slowly cooled to 100° C. and quenched in water at room temperature.

These sheets 10 were preheated to 158° C. and then drawn for orientation by rolling into a draw ratio of 15 at 158° C.

The drawn sheets 20 were cut into rectangular specimens (15 cm wide, 15 cm length). The rectangular specimens were then glued together on the flat side by intervening thin layers of adhesive into about 15 cm height, thereby making the direction of all the drawn sheets uniform. This laminates are sliced into a 3 mm width corresponding to the thickness of substrates 30 in the vertical direction against the drawn direction of sheets, using a circular saw. Thereby, a plurality of substrates 30 of the size (15 cm wide, 15 cm length and thickness 3 mm) are obtained. The thermal conductivity of this substrate taken along the thickness direction was about 13 m$\overline{W}$cm$^{-1}$deg$^{-1}$ at 298° K., which was about 6 times as high as that of the unoriented samples.

EXAMPLE 2

A plurality of isotropic sheets 10 (10 mm thickness, 15 cm wide) of polyethylene were prepared by compression molding of the polymer pellets at about 170° C. The sheets 10 were then slowly cooled to 100° C. and quenched in water at room temperature.

These sheets 10 were preheated at 100° C. and then drawn for orientation by rolling into a draw ratio of 20 at 100° C. The drawn sheets 20 were cut into rectangular specimens (15 cm wide, 15 cm length). The rectangular specimens were then glued together on the flat side by intervening thin layers of adhesive into about 15 cm height, thereby making the direction of all the drawn sheets uniform. These laminates were then sliced into a 3 mm width corresponding to the thickness of substrates 30 in the vertical direction against the drawn direction of sheets, using a circular saw. As a result, a plurality of substrates 30 of the size (15 cm wide, 15 cm length and thickness 3 cm) were obtained. The thermal conductivity of this substrate taken along the thickness direction was 110 m$\overline{W}$cm$^{-1}$ deg$^{-1}$ at 298° K., which was about 20 times as high as that of the unoriented samples.

Having fully described the present invention, it will be apparent to one of ordinary skill in the art that many changes and modifications can be made thereto without departing from the spirit or scope of the invention as set forth herein.

What is claimed as new and desired to be secured by Letters Patent of the United States is:

1. A plastic electrically insulating substrate, having high thermal conductivity, for wiring circuit boards, comprising a substrate having a major planar front surface for mounting an electrical device thereon and an opposite major planar back surface, said substrate being made of a laminate of a plurality of oriented sheets of one or more semicrystalline polymers having an oriented direction of said sheets which is uniform, wherein said oriented direction of said sheets is arranged in the direction of the substrate thickness perpendicular to said major planar front and back surfaces, and wherein said substrate has a thermal conductivity in the thickness direction in the range of 13 m$\overline{W}$cm$^{-1}$ deg$^{-1}$ to 110 m$\overline{W}$cm$^{-1}$ deg$^{-1}$ at 298° K.

2. The plastic electrically insulating substrate having high thermal conductivity, for wiring circuit boards as set forth in claim 1, wherein said oriented sheets are made of polypropylene.

3. The plastic electrically insulating substrate having high thermal conductivity, for wiring circuit boards as set forth in claim 1, wherein said oriented sheets are made of polyethylene.

4. The plastic electrically insulating substrate, having high thermal conductivity, for wiring circuit boards as set forth in claim 1, wherein said oriented sheets are made of poly(ethylene terephthalate), poly(vinylidene fluoride), polyoxymethylene and polychlorotrifluoromethylene.

5. A wiring circuit board comprising:
   (a) a plastic electrically insulating substrate, having high thermal conductivity, containing a substrate having a major planar front surface for mounting an electrical device thereon, and an opposite major planar back surface, said substrate being made of a laminate of a plurality of oriented sheets of one or more semicrystalline polymers having and oriented direction of said sheets which is uniform, wherein the oriented direction of the sheets is arranged in the direction of the substrate thickness perpendicular to said major planar front and back surfaces, and wherein said substrate has a thermal conductivity in the thickness direction in the range of 13 m$\overline{W}$cm$^{-1}$ deg$^{-1}$ to 110 m$\overline{W}$cm$^{-1}$ deg$^{-1}$ at 298° K.

6. The wiring circuit board as set forth in claim 5, wherein said electrical device is a transistor or Integrated Circuit.

* * * * *